(12) United States Patent
Kim et al.

(10) Patent No.: US 7,864,590 B2
(45) Date of Patent: Jan. 4, 2011

(54) NON-VOLATILE MEMORY DEVICE AND METHOD OF OPERATING THE SAME

(75) Inventors: You Sung Kim, Seoul (KR); Tae Ho Shin, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 108 days.

(21) Appl. No.: 12/117,702

(22) Filed: May 8, 2008

(65) Prior Publication Data

US 2009/0168535 A1 Jul. 2, 2009

(30) Foreign Application Priority Data

Dec. 28, 2007 (KR) .................. 10-2007-0140188

(51) Int. Cl.
*G11C 16/06* (2006.01)
*G11C 16/04* (2006.01)

(52) U.S. Cl. .................. 365/185.22; 365/185.03; 365/185.17

(58) Field of Classification Search ............ 365/185.02, 365/185.22

See application file for complete search history.

(56) References Cited

U.S. PATENT DOCUMENTS

| 7,057,939 | B2 * | 6/2006 | Li et al. ................ 365/185.28 |
|---|---|---|---|
| 7,508,705 | B2 * | 3/2009 | Chae et al. ............. 365/185.03 |
| 7,532,495 | B2 * | 5/2009 | Youn et al. .................... 365/63 |
| 7,589,998 | B2 * | 9/2009 | Kang et al. ............ 365/185.05 |
| 7,594,157 | B2 * | 9/2009 | Choi et al. .................. 714/764 |
| 7,596,022 | B2 * | 9/2009 | Chae et al. ............. 365/185.03 |
| 2008/0080237 | A1 * | 4/2008 | Park ....................... 365/185.03 |
| 2009/0097313 | A1 * | 4/2009 | Park et al. .............. 365/185.03 |
| 2009/0103360 | A1 * | 4/2009 | Kang et al. ............ 365/185.03 |
| 2009/0225593 | A1 * | 9/2009 | Cha et al. .............. 365/185.03 |

FOREIGN PATENT DOCUMENTS

| KR | 1020060037648 A | 5/2006 |
|---|---|---|
| KR | 1020060108324 A | 10/2006 |

* cited by examiner

*Primary Examiner*—Son L Mai
(74) *Attorney, Agent, or Firm*—Townsend and Townsend and Crew LLP

(57) ABSTRACT

A non-volatile memory device includes a memory cell array and a controller. The memory cell array includes memory cells for data storage and a plurality of flag cells. The flag cells indicate program states of the memory cells for each of a plurality of word lines. The controller determines the program states of the memory cells by employing the flag cells and controls a pass voltage provided to a corresponding word line according to the determined program states.

11 Claims, 4 Drawing Sheets

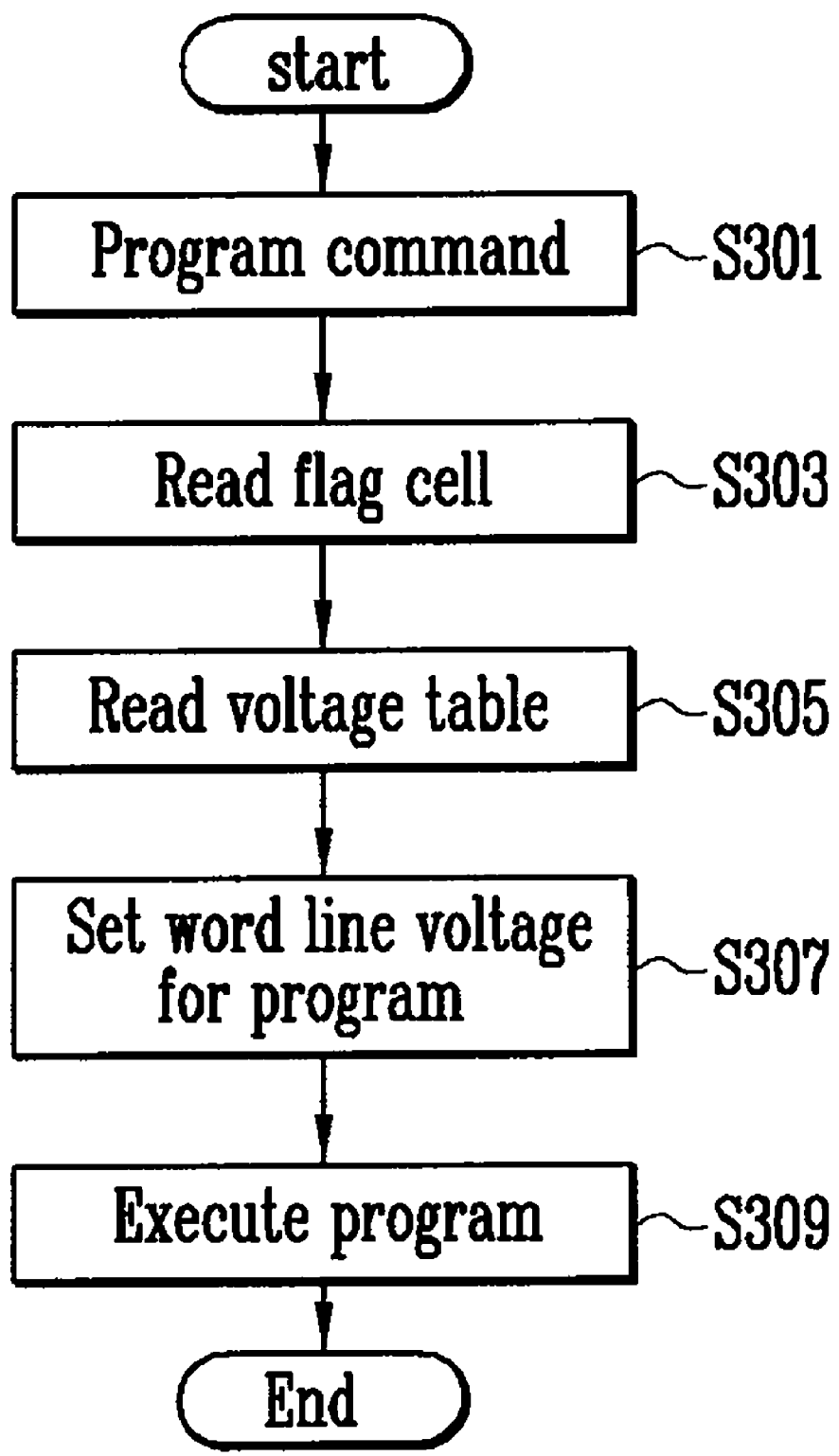

NON-VOLATILE MEMORY DEVICE AND METHOD OF OPERATING THE SAME

CROSS-REFERENCES TO RELATED APPLICATIONS

The present application claims priority to Korean patent application number 10-2007-140188, filed on Dec. 28, 2007, which is incorporated by reference in its entirety.

BACKGROUND OF THE INVENTION

The present invention relates to an operation of a non-volatile memory device and, more particularly, to a non-volatile memory device and a method of operating the same, in which a pass voltage is supplied depending on the characteristics of word lines.

Semiconductor memory devices can be classified into volatile memory devices which do not retain data, such as dynamic random access memory (DRAM) and static random access memory (SRAM), and non-volatile memory devices which retain data after the data is input.

Recently, there has been an increasing demand for flash memory into which data can be electrically input or from which data can be electrically erased. Flash memory is a device that can be electrically erased at a high speed without removing its circuits from a board. Flash memory is advantageous in that it has a simple memory cell structure and a low manufacturing cost per unit memory, and does not need a refresh function for retaining data.

Flash memory can be largely classified into the NOR type and the NAND type. The NOR flash memory requires one contact per two cells. It is disadvantageous in terms of higher integration, but is advantageous in terms of higher speed due to a high cell current. The NAND flash memory is disadvantageous in terms of higher speed due to a low cell current, but is advantageous in terms of higher integration since a plurality of cells shares one contact. Thus, NAND flash memory devices have become increasingly popular as next-generation memory devices in line with the rapid increase in the use of digital devices such as MP3 players, digital cameras, mobile devices, and assistant storage devices.

FIG. 1 is a sectional view showing a unit string of a NAND flash memory device.

Referring to FIG. 1, a unit string of a NAND flash device includes memory cells MC0, . . . , MC31. The memory cells are connected in series to constitute one string. Each memory cell has a gate in which a floating gate 110 and a control gate 120 are stacked between a drain select transistor DST for selecting a unit string and a source select transistor SST for selecting a ground.

The string is connected to a bit line BL. A structure in which the string and the bit line are connected is connected in parallel in plural numbers, thereby forming one block. The blocks are arranged symmetrically on the basis of a bit line contact. The select transistors DST, SST and the memory cells MC0, . . . , MC31 are arranged in matrix form of rows and columns. The gates of the drain select transistor DST and the source select transistor SST arranged in the same column are connected to a drain select line DSL and a source selective line SSL, respectively. The gates of the memory cells MC0, . . . , MC31 arranged in the same column are also connected to a plurality of corresponding word lines WL0, . . . , WL31. Further, the drain of the drain select transistor DST is connected to the bit line BL. A common source line CSL is connected to the source of the source select transistor SST.

A program operation of the NAND flash memory device constructed as above is described below.

A selected bit line is applied with a voltage of 0V and a selected word line is applied with a program voltage Vpgm to perform a program operation. Electrons of a channel region are injected into the floating gate by the Fowler-Nordheim (F-N) tunneling mechanism due to a high voltage difference between the channel region and the control gate of a selected memory cell.

The program voltage Vpgm is applied to not only a selected memory cell, but also unselected memory cells arranged in the same word line. Thus, the unselected memory cells connected to the same word line are also programmed. This phenomenon is called program disturbance. To inhibit program disturbance, the source of a drain select transistor DST of a string, including an unselected memory cell connected to a selected word line and a unselected bit line, is discharged to Vcc-Vth (Vcc is a power supply voltage and Vth is the threshold voltage level of the drain select transistor), the selected word line is applied with the program voltage Vpgm, and the unselected word line is applied with the pass voltage Vpass so that a channel voltage Vch of memory cells belonging to the same string is boosted.

In the method of inhibiting unselected memory cells from being programmed by boosting the channel voltage, the degree of boosting can be varied depending on how program cells are arranged near a selected word line and how many memory cells are in a program state. Further, disturbance may be caused since boosting is not sufficient.

BRIEF SUMMARY OF THE INVENTION

The present invention is directed towards a non-volatile memory device and a method of operating the same, in which boosting can be generated sufficiently by applying a pass voltage, which is changed according to a degree that a memory cell connected to a unselected word line is programmed at the time of a program operation.

A non-volatile memory device according to an aspect of the present invention includes a memory cell array and a controller. The memory cell array includes memory cells for data storage and a plurality of flag cells. The flag cells indicate program states of the memory cells for every word line. The controller determines the program states of the memory cells by employing the flag cells and controls a pass voltage provided to a corresponding word line according to the determination result.

The flag cells are connected to the word lines.

The controller includes a storage unit for storing pass voltage information of the word lines. The pass voltage is set according to a degree to which the memory cells of each word line are programmed.

The controller controls a voltage level of a drain select line according to the program state of the memory cells connected to the word line when reading the memory cells.

The word lines are divided into one or more groups and the pass voltage is set on a per group basis.

A non-volatile memory device according to another aspect of the present invention includes a memory cell array and a controller. In the memory cell array, memory cells for data storage and a plurality of flag cells are connected for every word line. The flag cells indicate program states of the memory cells for every word line. The controller determines the program states of the memory cells connected to each word line by employing the flag cells. The controller may control a pass voltage provided to a corresponding word line according to the determination result, or may control a voltage level applied to a drain select transistor according to the determination result when reading data.

A method of programming a non-volatile memory device according to still another aspect of the present invention includes reading flag cells of a selected word line, loading pass voltage information to a word line corresponding to each of flag cells according to program states of the read flag cells except for the selected word line, and providing the loaded pass voltage to each word line.

As a degree to which the memory cells connected to the word line are programmed increases, a level of the pass voltage is increased.

The pass voltage information according to a program state is previously stored in the memory cells connected to each word line.

A method of reading a non-volatile memory device according to further still another aspect of the present invention includes reading flag cells of a selected word line, setting a pass voltage to a word line corresponding to each of the flag cells according to program states of the read flag cells except for the selected word line, setting a voltage level of a drain select line according to the program states of the read flag cells, and sensing data stored in memory cells connected to the selected word line.

As a degree to which the word line is programmed increases, a level of the pass voltage is increased.

The pass voltage information according to a program state and voltage information of the drain select line are previously stored in the memory cells connected to each word line.

BRIEF DESCRIPTION OF THE DRAWINGS

FIG. 3 is a flowchart illustrating a program operation according to an embodiment of the present invention.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1:
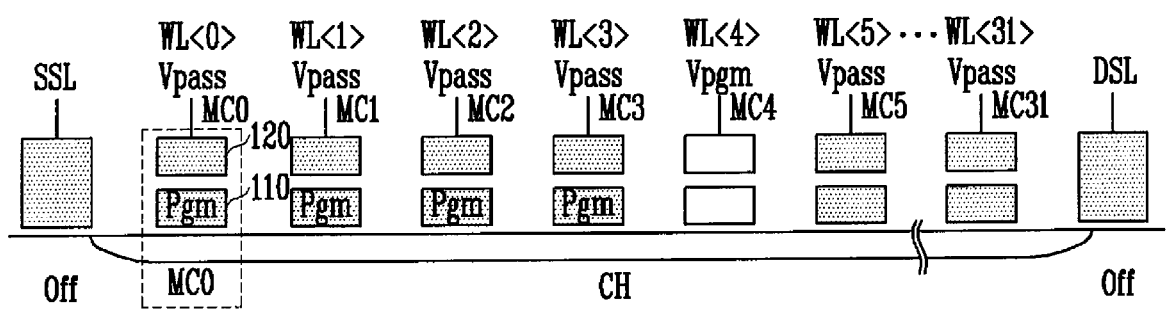
FIG. 1 is a sectional view showing a unit string of a NAND flash memory device.
Figure 2A:
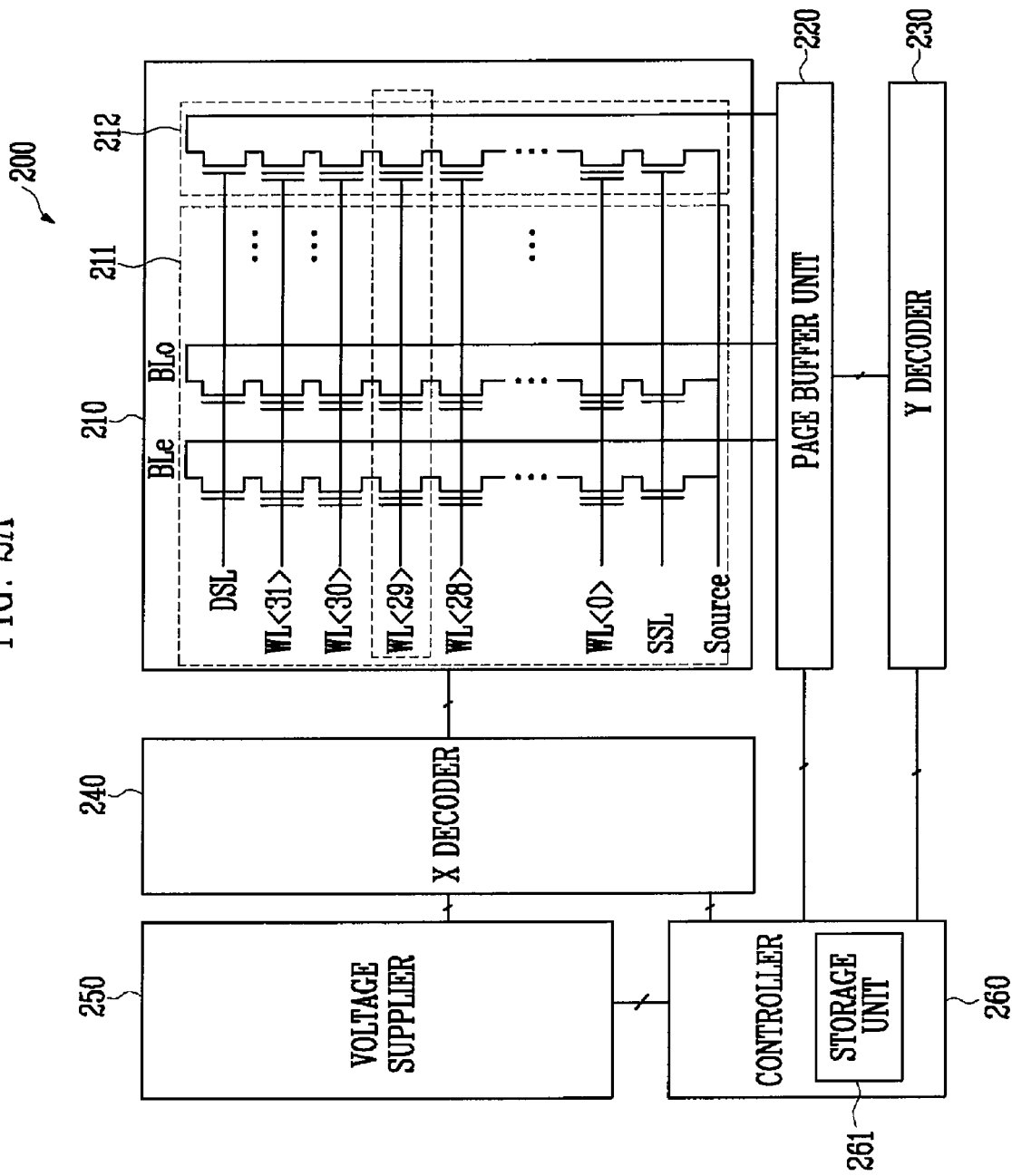
FIG. 2A is a block diagram showing the structure of a flash memory device according to an embodiment of the present invention.

FIG. 2A is a block diagram showing the structure of a flash memory device according to an embodiment of the present invention.

Referring to FIG. 2A, a flash memory device 200 according to an embodiment of the present invention includes a memory cell array 210, a page buffer unit 220, a Y decoder 230, an X decoder 240, a voltage supplier 250, and a controller 260.

The memory cell array 210 includes a main cell unit 211 having memory cells for data storage and a flag cell unit 212 having flag cells. The main cell unit 211 includes a plurality of cell strings in which the memory cells are connected in series. Each cell string is connected to a bit line. The gates of the memory cells are connected to first to thirty-second word lines WL<0> to WL<31> in a direction orthogonal to the bit line. The flag cells of the flag cell unit 212 indicate the program states of the respective word lines.

The flag cell unit 212 includes one or more flag cells. This construction is identical to that of a cell string of a memory cell array. The flag cells indicating the program states of the respective word lines are included in the word lines.

That is, as in an embodiment of the present invention, the memory cell array including the first to thirty-second word lines WL<0> to WL<31> requires the flag cells for indicating the program states of the 32 word lines. When the number of the flag cells necessary to indicate the program states of the 32 word lines is 32, 32 flag cells are connected to the first to thirty-second word lines WL<0> to WL<31>, respectively.

The page buffer unit 220 includes a plurality of page buffers connected to the bit lines of the memory cell array 210. Each page buffer functions to temporarily store data, which will be programmed into a selected memory cell. The data is then transferred to the memory cell through the bit line, or the data is read and then stored in the memory cell.

The Y decoder 230 provides an input/output path to the page buffers of the page buffer unit 220 according to an input address. The X decoder 240 selects the word lines of the memory cell array 210 according to an input address.

The voltage supplier 250 generates operating voltages under the control of the controller 260. The operating voltages are supplied to a word line connected by the X decoder 240. The controller 260 outputs a control signal in response to an operation command and controls the voltage supplier 250 to supply a pass voltage which is set according to a degree to which data of the memory cell array 210 is programmed.

The controller 260 includes a storage unit 261 for storing voltage tables. The voltage tables include pass voltage information which is changed according to a degree that data of the memory cells is programmed.

In the flash memory device 200, a program operation is generally performed in the direction from the first word line WL<0> to the thirty-second word line WL<31>. If a program operation on each word line is completed, a flag cell connected to a corresponding word line is programmed.

The memory cells of the main cell unit 211 and the flag cells of the flag cell unit 212, constituting one word line, are indicated as a block.

Figure 2B:
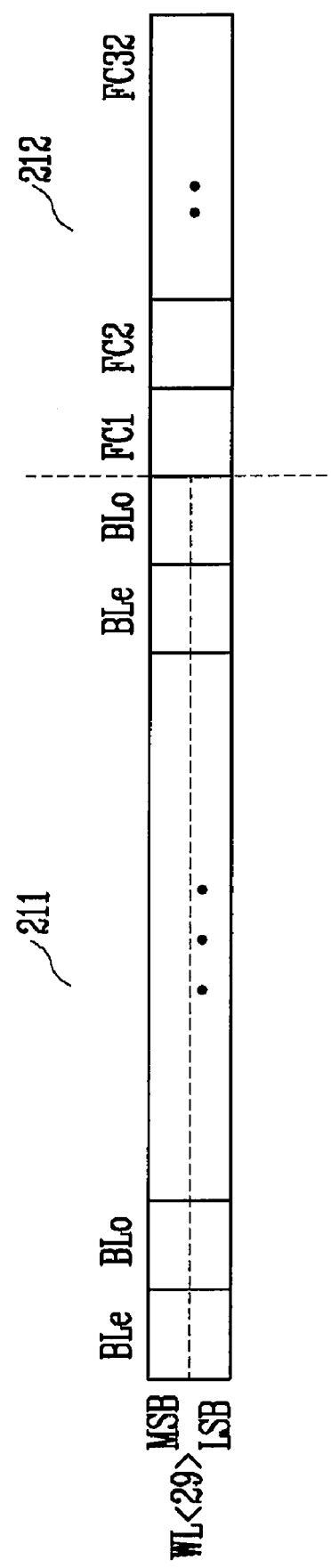
FIG. 2B is a block diagram showing the construction of one word line shown in FIG. 2A.

FIG. 2B is a block diagram showing the construction of one word line shown in FIG. 2A.

FIG. 2B is a block diagram representatively showing the thirtieth word line WL<29>. The main cell unit 211 includes memory cells comprised of logical pages of a least significant bit (LSB) and a most significant bit (MSB). The flag cell unit 212 includes a first flag cell FC1 to a thirty-second flag cell FC32. The first flag cell FC1 indicates the program state of the first word line WL<0> and the thirty-second flag cell FC32 indicates the program state of the thirty-second word line WL<31>.

As described above, if the flag cells connected to one word line are read in a state where the respective word lines are constructed, the program state of all of the word lines can be known.

In an embodiment of the present invention, when the thirtieth word line WL<29> is selected for program, the flag cells connected to the thirtieth word line WL<29> are read before performing a program operation. Further, the program states of the first to thirty-second word lines WL<0> to WL<31> can be determined based on the states of the flag cells, and pass voltages when performing the program operation can be decided based on the program states of the respective word lines.

That is, the thirtieth word line WL<29> is a word line selected for program and is applied with a program voltage. The remaining word lines are applied with different pass voltages according to respective program states.

Information about the pass voltages applied according to the program states of the respective word lines is stored in the storage unit 261 of the controller 260. The respective pass voltages can be set by employing threshold voltages according to a degree to which a memory cell is programmed.

The following table lists examples of voltage tables indicating pass voltages set according to the program states of the word lines having N logical pages.

TABLE

|  | First page | Second page | ... | $N^{th}$ page |
|---|---|---|---|---|
| DSL | $Vdsl\_1^{st}$ | $Vdsl\_2^{nd}$ | ... | $Vdsl\_N^{th}$ |
| WL<0> | $Vwl0\_1^{st}$ | $Vwl0\_2^{nd}$ | ... | $Vwl0\_N^{th}$ |
| WL<1> | $Vwl1\_1^{st}$ | $Vwl1\_2^{nd}$ | ... | $Vwl1\_N^{th}$ |
| WL<2> | $Vwl2\_1^{st}$ | $Vwl2\_2^{nd}$ | ... | $Vwl2\_N^{th}$ |
| ... | ... | ... | ... |  |
| WL<32> | $Vwl32\_1^{st}$ | $Vwl32\_2^{nd}$ | ... | $Vwl32\_N^{th}$ |

The above table is a voltage table when pass voltages, which are changed according to respective program degrees, are applied to the word lines. A method of dividing the word lines into several groups and setting pass voltages according to program degrees on a per group basis can also be applied.

Further, the DSL voltages shown in the above table indicate voltage levels of the drain select lines applied to the gates of the drain select transistors. The controller 260 can also determine how many of the memory cells of the memory cell array 210 have been programmed. The controller 260 also changes the DSL voltages. Since the drain select transistor functions to transfer the state of the memory cell through the bit line, a read evaluation time at the time of data reading can be controlled constantly by changing the DSL voltages according to the number of programmed cells.

That is, although many memory cells are programmed, many more drain select transistors can be turned on by increasing the DSL voltage. Thus, the states of the memory cells can be evaluated sufficiently at a preset read evaluation time of a bit line.

Accordingly, a case where the DSL voltage is controlled can be applied when performing data reading.

The program operation of the flash memory device 200 is performed as follows.

FIG. 3 is a flowchart illustrating a program operation according to an embodiment of the present invention.

Referring to FIG. 3, if a program command is input to the flash memory device 200 at step S301, the controller 260 checks a word line on which program will be performed using an input address together with the program command and reads flag cells of a corresponding word line at step S303.

That is, when programming the thirtieth word line WL<29> according to an embodiment of the present invention, the controller 260 reads all the flag cells of the flag cell unit 212 of the thirtieth word line WL<29> and determines the program states of the first to thirty-second word lines WL<0> to WL<31> according to the program states of the flag cells.

The controller 260 then reads a voltage table stored in the storage unit 261 according to the reading result of the flag cells at step S305.

The controller 260 sets a pass voltage to each word line in accordance with the voltage table and controls the voltage supplier 250 and the X decoder 240 to supply the thirtieth word line WL<29> with a program voltage and the remaining word lines with a set pass voltage at step S307.

After the word line voltage is set, the controller 260 executes a program according to a program method of the flash memory device 200 at step S309.

If a pass voltage is set according to the program state of a word line as described above, the threshold voltages of memory cells connected to each word line remain turned on by the pass voltages similarly to other states. Accordingly, the influence of peripheral cells on memory cells that are programmed can be minimized and sufficient self-boosting can be generated in a cell string whose program is prohibited when performing a program operation.

The above operation has been described in connection with the method of applying the pass voltages in the process of performing a program. A method of checking a degree to which a word line has been programmed using flag cells as described above and deciding a pass voltage according to a voltage table can be used in other operations such as a verify operation and a read operation of the flash memory device 200.

As described above, according to the non-volatile memory device and the method of operating the same in accordance with the present invention, the voltage level of a pass voltage is controlled and the voltage level of a drain select line is changed according to a degree to which memory cells connected to word lines not selected for program are programmed. Accordingly, self-boosting can be generated effectively and a disturbance phenomenon can be prevented.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A non-volatile memory device, comprising:
    a memory cell array comprising a plurality memory cells for data storage;
    flag cells for storing program states of logical pages in a plurality of word lines, wherein the flag cells that are connected to a word line store the program states of all of the word lines; and
    a controller for determining all program states of the logical pages of all of the word lines by employing the flag cells, the flag cells being connected to one word line that is selected to perform a program operation or a read operation, and for changing a pass voltage provided to word lines that are not selected during the program operation or the read operation in response to the determined program states.

2. The non-volatile memory device of claim 1, wherein the controller comprises a storage unit for storing pass voltage information of the word lines, the pass voltage being set according to a degree to which the word line is programmed.

3. The non-volatile memory device of claim 1, wherein the controller controls a voltage level of a drain select line according to the program state of the corresponding word line.

4. The non-volatile memory device of claim 2, wherein the word lines are divided into one or more groups and the pass voltage is set on a per group basis.

5. A non-volatile memory device, comprising:
    a memory cell array comprising main cell strings including first to n memory cells connected in series between a drain select transistor and a source select transistor and flag cells including first to n flag cells connected in series between a drain select transistor and a source select transistor, gates of the drain select transistors being connected to drain select lines in common, gates of the source select transistors being connected to source select lines in common, gates of the first to n memory cells being connected to first to n word lines, respectively, and gates of the first to n flag cells being connected to the first to n word lines, respectively, wherein the flag cells store program states of logical pages in the first to n word lines, the flag cells that are connected to a word line storing the program states of all of the first to n word lines; and a controller for determining all program states of the logical pages of all of the first to n word lines by employing the flag cells, the flag cells being connected to one word line that is selected to perform a program operation or a read operation, and for changing a pass voltage provided to word lines that are not selected or for changing a voltage of the drain select line during the program operation or the read operation in response to the determined program states.

6. A method of programming a non-volatile memory device, the method comprising:

reading first flag cells of a selected word line;

loading pass voltage information to a word line corresponding to each of second flag cells according to program states of the read first flag cells, wherein the pass voltage information is not loaded to the selected word line; and providing a pass voltage corresponding to the loaded pass voltage information to each word line.

7. The method of claim 6, wherein as a degree to which the memory cells connected to the word line are programmed increases, a level of the pass voltage is increased.

8. The method of claim 6, wherein the pass voltage information according to a program state is previously stored in the memory cells connected to each word line.

9. A method of reading a non-volatile memory device, the method comprising:

reading first flag cells of a selected word line;

setting a pass voltage to a word line corresponding to each of second flag cells according to program states of the read first flag cells, wherein the pass voltage is not set to the selected word line;

setting a voltage level of a drain select line according to the program states of the read first flag cells; and sensing data stored in memory cells connected to the selected word line.

10. The method of claim 9, wherein as a degree to which the word line is programmed increases, a level of the pass voltage is increased.

11. The method of claim 9, wherein the pass voltage information according to a program state and voltage information of the drain select line are previously stored in the memory cells connected to each word line.

\* \* \* \* \*